（12） United States Patent
Tanaka et al.

(10) Patent No.: US 10,283,398 B2
(45) Date of Patent: May 7, 2019

(54) SUBSTRATE PLACING TABLE

(71) Applicant: TOKYO ELECTRON LIMITED, Tokyo (JP)

(72) Inventors: Atsushi Tanaka, Nirasaki (JP); Ryohei Ogawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/521,217

(22) PCT Filed: Sep. 17, 2015

(86) PCT No.: PCT/JP2015/076423
§ 371 (c)(1),
(2) Date: Apr. 21, 2017

(87) PCT Pub. No.: WO2016/067785
PCT Pub. Date: May 6, 2016

(65) Prior Publication Data
US 2017/0352576 A1 Dec. 7, 2017

(30) Foreign Application Priority Data

Oct. 30, 2014 (JP) ................................ 2014-222039

(51) Int. Cl.
*H01L 21/68* (2006.01)
*H01L 21/687* (2006.01)
(Continued)

(52) U.S. Cl.
CPC .... *H01L 21/68785* (2013.01); *H01L 21/3065* (2013.01); *H01L 21/67069* (2013.01); *H01L 21/67103* (2013.01); *H01L 21/31116* (2013.01)

(58) Field of Classification Search
CPC ......... H01L 21/68785; H01L 21/67069; H01L 21/67109; H01L 21/683; H01L 21/6831;
(Continued)

(56) References Cited

U.S. PATENT DOCUMENTS 3,361,195 A * 1/1968 Motto, Jr. ........... H01L 23/4735
165/139
4,494,171 A * 1/1985 Bland ..................... F28F 3/086
165/908
(Continued)

FOREIGN PATENT DOCUMENTS

JP 2003-524885 A 8/2003
JP 2003-324095 A 11/2003
(Continued)

OTHER PUBLICATIONS

International Search Report dated Dec. 22, 2015 issued in corresponding International Application No. PCT/JP2015/076423.

*Primary Examiner* — Tho V Duong
(74) *Attorney, Agent, or Firm* — Nath, Goldberg & Meyer; Jerald L. Meyer (57) ABSTRACT

A substrate placing table, which is installed inside a processing container for processing a wafer, includes: a stage configured to place a water on an upper surface thereof and including an inner peripheral flow channel and an outer peripheral flow channel formed therein to circulate a heat medium of a predetermined temperature therethrough; a support table configured to support the stage; and a temperature adjusting plate installed between the stage and the support table, and including a temperature adjusting mechanism configured to adjust a temperature of a heat radiation portion at which heat is radiated between the stage and the support table.

2 Claims, 6 Drawing Sheets

(51) Int. Cl.
*H01L 21/3065* (2006.01)
*H01L 21/67* (2006.01)
*H01L 21/311* (2006.01)

(58) Field of Classification Search
CPC ........... H01L 21/6833; H01L 21/67103; H01L 23/473
USPC ..................................... 165/80.4; 156/345.37
See application file for complete search history.

(56) References Cited

U.S. PATENT DOCUMENTS

| | | | |
|---|---|---|---|
| 4,534,816 A * | 8/1985 | Chen .................. | H01J 37/3244 156/345.37 |
| 4,628,991 A * | 12/1986 | Hsiao ................ | G01R 31/2891 165/168 |
| 7,987,899 B2 * | 8/2011 | Kurtz ...................... | F28F 3/048 165/168 |
| 2012/0285658 A1* | 11/2012 | Roy .................. | H01L 21/67109 165/47 |

FOREIGN PATENT DOCUMENTS

| | | |
|---|---|---|
| JP | 2004-87869 A | 3/2004 |
| JP | 2007-214513 A | 8/2007 |
| JP | 2010-141081 A | 6/2010 |
| WO | 2012/029130 A1 | 3/2012 |

* cited by examiner

SUBSTRATE PLACING TABLE

CROSS-REFERENCE TO RELATED APPLICATIONS

This is a National Phase Application filed under 35 U.S.C. 371 as a national stage of PCT/JP2015/076423, filed Sep. 17, 2015, an application claiming the benefit of Japanese Patent Application No. 2014-222039, filed on Oct. 30, 2014, in the Japan Patent Office, the disclosure of which is incorporated herein in its entirety by reference.

TECHNICAL FIELD

The present disclosure relates to a placing table on which a substrate is placed in a substrate processing apparatus for processing the substrate.

BACKGROUND

In recent years, with the miniaturization of semiconductor devices, a finer etching process called a chemical oxide removal (COR) process has been used instead of conventional etching techniques such as dry etching or wet etching.

The COR process is a process of supplying a hydrogen fluoride (HF) gas and an ammonia ($NH_3$) gas as process gases onto, for example, a silicon oxide ($SiO_2$) film formed on a surface of a semiconductor wafer (hereinafter, referred to as a "wafer") as a substrate under vacuum and allowing the process gases to react with the silicon oxide film so as to produce a reaction product (for example, Patent Document 1). In the COR process, in order to maintain a temperature of the wafer at a desired temperature, the wafer is subjected to a process in a state where the wafer is placed on a placing table configured to adjust the temperature of the wafer.

In addition, the product produced on the surface of the wafer by the COR process is sublimated by heating performed in a subsequent process so that the silicon oxide film is removed from the surface of the wafer.

PRIOR ART DOCUMENTS

Patent Document

Patent Document 1: Japanese laid-open publication No. 2007-214513

On the other hand, like the aforementioned COR process, in the case where the wafer is processed while keeping the interior of a processing container under vacuum, the smaller the inner volume of the processing container is, the shorter the time required for exhaust is. As such, the processing container needs to be reduced in scale as much as possible from the viewpoint of improving the throughput of the wafer process. In addition, the largest part in the processing container is a placing table for placing the wafer thereon, and the size of the processing container is mainly dependent on a size of the placing table. Thus, to miniaturize the processing container requires reducing the size of the placing table.

Figure 7:
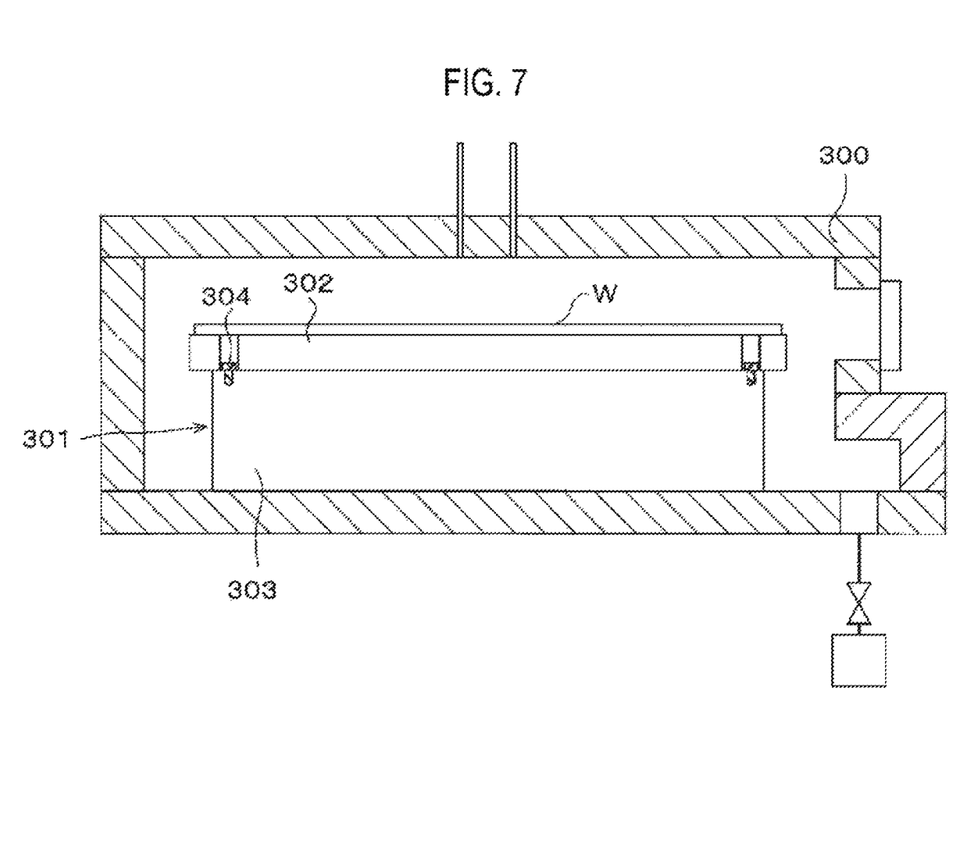
FIG. 7 is a view illustrating a schematic configuration of a substrate processing apparatus that includes a partition wall formed to surround a substrate placing table.

However, the present inventors have confirmed that if the placing table is miniaturized, it is difficult to uniformly adjust the temperature of the wafer in-plane throughout, which causes a change in the process throughout the wafer in-plane. More specifically, for example, as shown in FIG. 7, if the diameter of a stage 302 of a placing table 301 for placing the wafer W thereon is set to become closer to that of the wafer W so as to miniaturize the processing container 300, a bolt 304 for fastening the stage 302 and a support table 303 for supporting the stage 302 overlaps the wafer W in position when viewed from the top. As such, the heat of the processing container 300 is radiated to the stage 302 through the support table 303 and the bolt 304. This may cause a difference in the temperature of the stage 302 between an area around the bolt 304 and other areas.

SUMMARY

The present disclosure is to minimize the influence of heat on a stage of a placing table for placing a substrate thereon.

The present disclosure provides a substrate placing table for placing a substrate thereon, which includes; a stage configured to place the substrate on an upper surface thereof, and including a heat medium flow channel formed therein to circulate a heat medium of a predetermined temperature therethrough; a support table configured to support the stage; and a temperature adjusting plate installed between the stage and the support table, and including a temperature adjusting mechanism configured to adjust a temperature of a heat radiation portion at which heat is radiated between the stage and the support table.

According to the present disclosure, the temperature adjusting plate, which is equipped with the temperature adjusting mechanism configured to adjust the temperature of the heat radiation portion at which heat is radiated between the stage and the support table, is installed between the stage and the support table. It is therefore possible to minimize the radiation of heat from the support table to the stage to a minimal level. Accordingly, it is possible to properly manage a temperature of the stage of the placing table, thus performing a desired substrate process.

According to the present disclosure, it is possible to minimize the influence of the radiation of heat to a stage of a placing table for placing a substrate thereon, to a minimal level.

DETAILED DESCRIPTION

Figure 1:
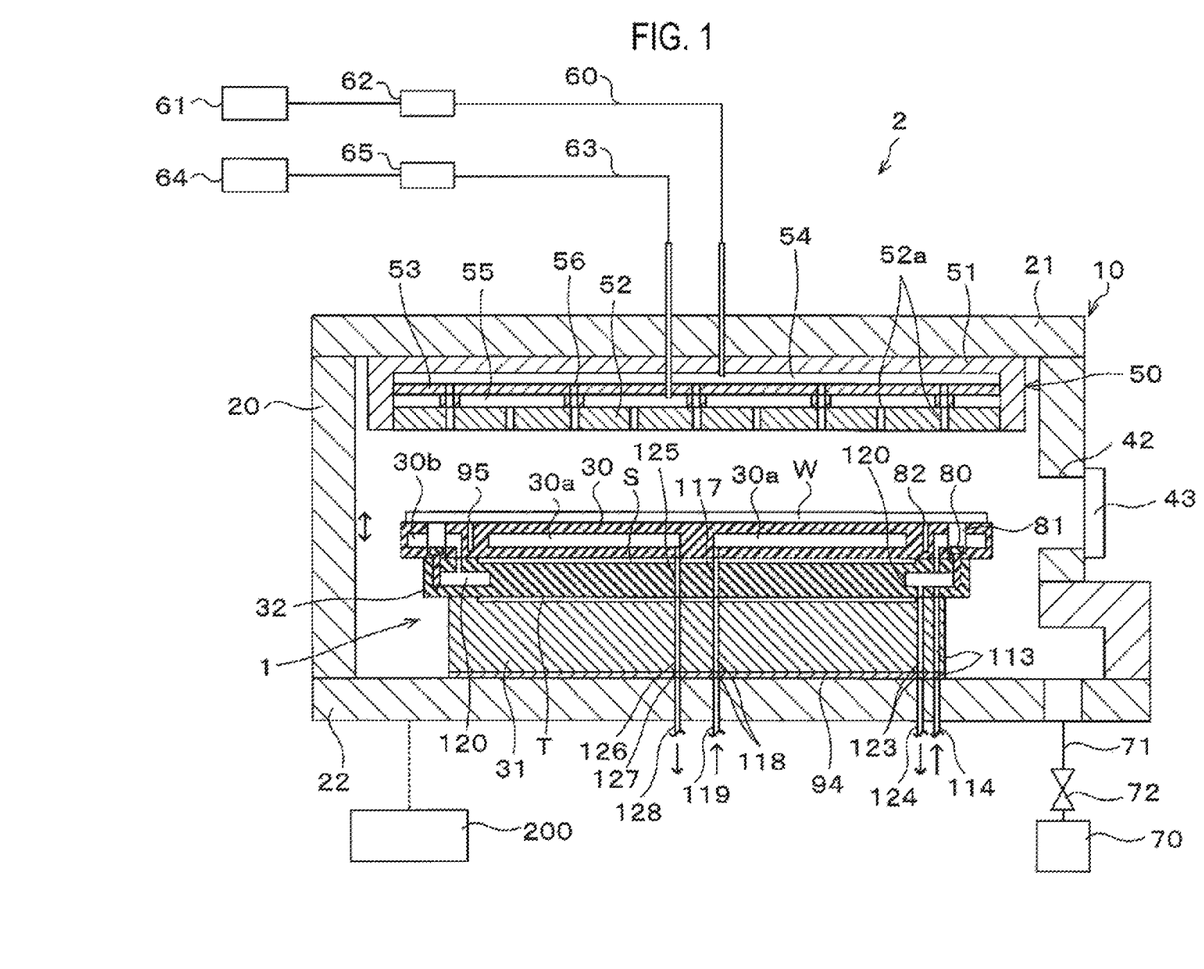
FIG. 1 is a vertical cross-sectional view schematically illustrating a configuration of a substrate processing apparatus provided with a substrate placing table according to an embodiment of the present embodiment.

Hereinafter, embodiments of the present disclosure will be described with reference to the accompanying drawings. In addition, in the present specification and drawings, elements that have substantially the same function and configuration will bear the same reference numeral and thus a description thereof will be omitted to avoid duplication. FIG. 1 is a vertical cross-sectional view schematically illustrating a configuration of a substrate processing apparatus 2 provided with a substrate placing table 1 according to an embodiment of the present embodiment. In addition, a description will be made of an example in which the substrate processing apparatus 2 performs a COR process with respect to a wafer W.

For example, as shown in FIG. 1, the substrate processing apparatus 2 includes an air-tightly sealed processing container 10 and a substrate placing table 1 configured to place a wafer W thereon inside the processing container 10. The processing container 10 is a container which is made of, for example, metal such as aluminium or stainless steel and has, for example, a substantially rectangular parallelepiped shape as a whole. The processing container 10 includes sidewalls 20 having, for example, a substantially rectangular barrel shape when viewed from the top, a ceiling plate 21 that covers the upper end of the sidewalls 20, and a bottom plate 22 that covers the lower end of the sidewalls 20. A heating mechanism such as a heater (not shown) is embedded in the sidewalls 20 to prevent a reaction product from adhering to the interior of the processing container 10 in the COR process. The processing container 10 is heated to, for example, about 130 degrees C. by the heater.

The substrate placing table 1 includes a stage 30 having a placing surface on which the wafer W is placed, a support table 31 for supporting the stage 30, and a temperature adjusting plate 32 installed between the stage 30 and the support table 31. The stage 30, the support table 31, and the temperature adjusting plate 32 have a substantially disc shape, respectively. Details of the substrate placing table 1 will be described later.

A height of the substrate placing table 1 is set such that the upper surface of the stage 30 and a transfer port 42 formed in the sidewall 20 of the processing container 10 are positioned at the same vertical level. Thus, the water W can be loaded into or unloaded from the processing container 10 through the transfer port 42. A shutter 43 is installed in the transfer port 42 to open and close the transfer port 42.

A shower head 50 is installed on a lower surface of the ceiling plate 21 of the processing container 10 while facing the stage 30 of the substrate placing table 1. For example, the shower head 50 includes a substantially cylindrical frame body 51 with its lower portion opened and supported on the lower surface of the ceiling plate 21, a substantially disc-shaped shower plate 52 which is inserted to an inner peripheral surface of the frame body 51 and is spaced apart at a predetermined distance from a ceiling portion of the frame body 51, and a plate 53 installed between the shower plate 52 and the frame body 51 in a parallel relationship with the shower plate 52.

The shower plate 52 has a plurality of openings 52a formed to pass through the shower plate 52 in a thickness direction thereof. A first space 54 is defined between the ceiling portion of the frame body 51 and an upper surface of the plate 53. In addition, a second space 55 is defined between a lower surface of the plate 53 and an upper surface of the shower plate 52.

The plate 53 has a plurality of gas flow channels 56 formed to pass through the plate 53 in a thickness direction thereof. The number of the gas flow channels 56 is approximately half of the number of the openings 52a of the shower plate 52. Each of the gas flow channels 56 is formed to extend up to the upper surface of the shower plate 52 located under the plate 53 and is ultimately connected to an upper end portion of the respective opening 52a. Therefore, inner spaces of the gas flow channel 56 and the opening 52a connected thereto are isolated from the second space 55. The shower plate 52 and the plate 53 are made of, for example, metal such as aluminium.

A first gas supply source 61 is coupled to the first space 54 defined between the lower surface of the frame body 51 and the plate 53 through a first gas supply pipe 60. The first gas supply source 61 is configured to supply, as a predetermined first process gas, a mixed gas of, for example, a hydrogen fluoride (HF) gas as a reaction gas and an argon (Ar) gas as a dilution gas. A flow rate adjustment mechanism 62 for adjusting a supply flow rate of the first process gas is installed in the first gas supply pipe 60. The first process gas supplied from the first gas supply source 61 is supplied into the processing container 10 through the first space 54, the gas flow channels 56 of the plate 53, and the openings 52a of the shower plate 52.

In addition, a second gas supply source 64 is coupled to the second space 55 through the second gas supply pipe 63. Like the first gas supply source 61, the second gas supply source 64 is configured to supply a predetermined second process gas. A flow rate adjustment mechanism 65 for adjusting a supply flow rate of the second process gas is installed in the second gas supply pipe 63. The second process gas supplied from the second gas supply source 64 is supplied into the processing container 10 through the second space 55 and the openings 52a of the shower plate 52. Therefore, the first process gas and the second process gas are initially mixed at a position under the shower plate 52 in the processing container 10.

An exhaust mechanism 70 for exhausting the interior of the processing container 10 is coupled to the bottom plate 22 of the processing container 10 in the outside of the substrate placing table 1 through an exhaust pipe 71. An adjusting valve 72 for adjusting an exhaust amount of gas by the exhaust mechanism 70 is installed in the exhaust pipe 71, thus controlling an internal pressure of the processing container 10.

Figure 2:
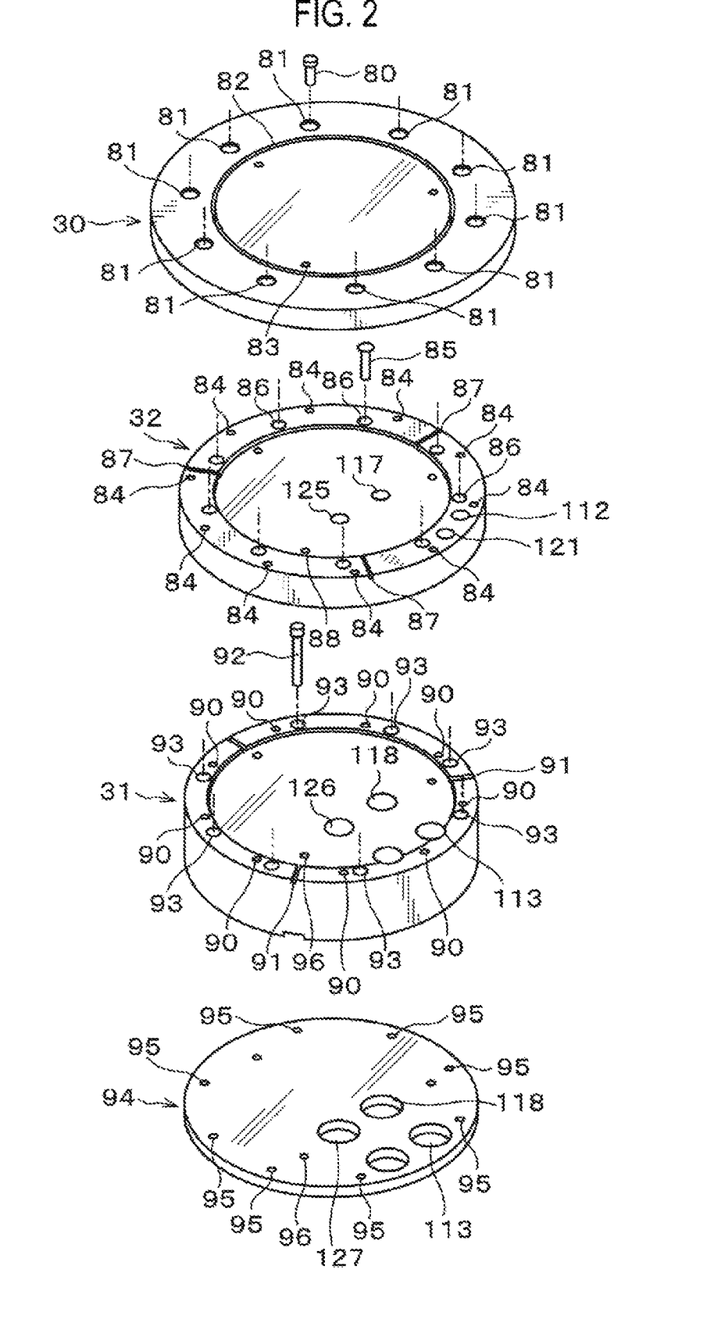
FIG. 2 is a perspective view schematically showing configurations of a stage, a support table, and a temperature adjusting plate when viewed from above.
Figure 3:
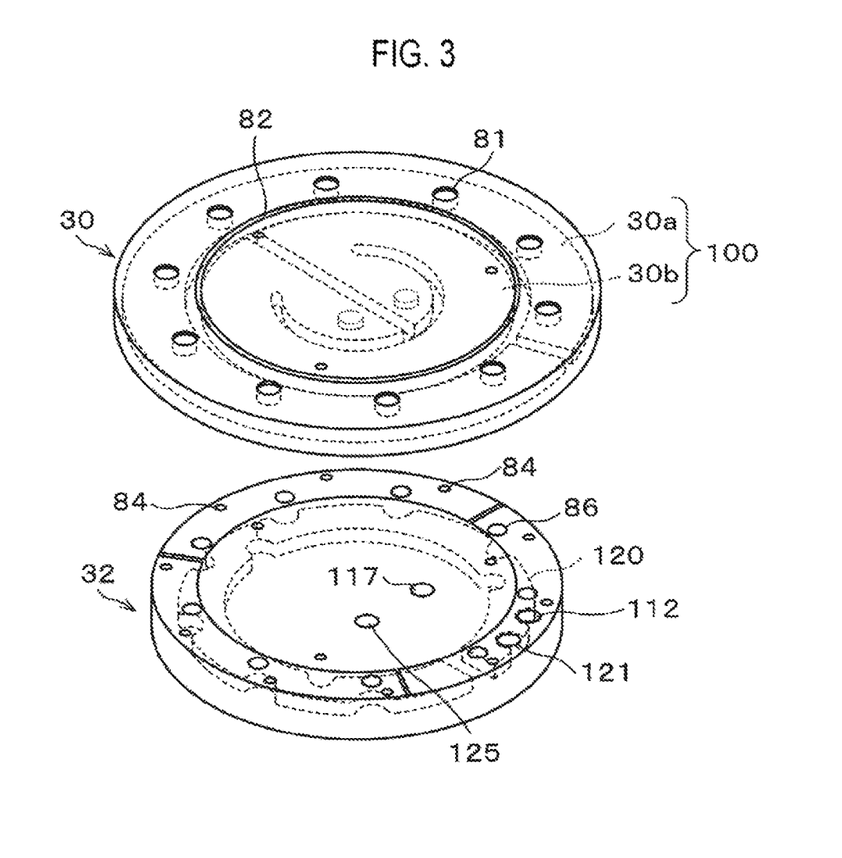
FIG. 3 is a perspective view schematically showing an internal configuration of a stage and a temperature adjusting plate when viewed from above.
Figure 4:
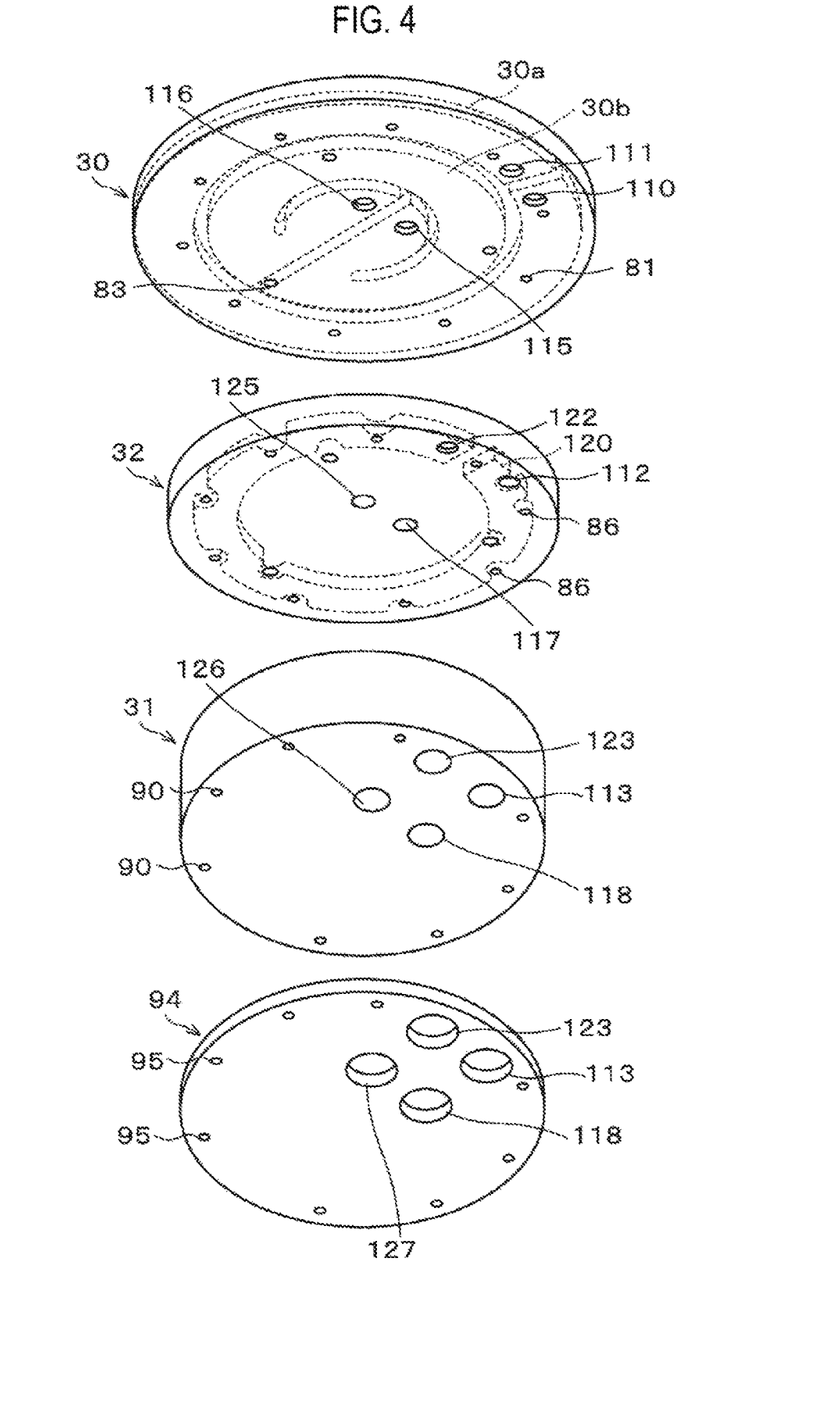
FIG. 4 is a perspective view schematically showing configurations of a stage, a support table, and a temperature adjusting plate when viewed from below.

Next, a configuration of the substrate placing table 1 will be described in detail with reference to FIGS. 2, 3 and 4. As described above, the substrate placing table 1 includes the stage 30, the support table 31, and the temperature adjusting plate 32, which are formed in an approximate disc shape. FIG. 2 is a perspective view schematically showing configurations of the stage 30, the support table 31, and the temperature adjusting plate 32 when viewed obliquely from above. FIG. 3 is a perspective view schematically showing internal configurations of the stage 30 and the temperature adjusting plate 32 when viewed obliquely from above. FIG. 4 is a perspective view of the stage 30, the support table 31, and the temperature adjusting plate 32 when viewed obliquely from below, while illustrating the internal configurations of the stage 30 and the temperature adjusting plate 32.

The stage 30, the support table 31, and the temperature adjusting plate 32 are formed of, for example, aluminium. In addition, although in FIGS. 1 and 2, the stage 30, the temperature adjusting plate 32, and the support table 31 has been shown to be decreased in diameter in that order, the setting of the diameters of the stage 30, the temperature adjusting plate 32, and the support table 31 is not limited to the present embodiment. As an example, the stage 30, the temperature adjusting plate 32, and the support table 31 may have the same diameter. In addition, in the present embodiment, the diameter of the wafer W is set to 300 mm, and the diameter of the stage 30 is set to, for example, 307 mm, which is slightly larger than the wafer W.

For example, as shown in FIG. 2, a plurality of bolt holes 81 is concentrically formed in the outer peripheral portion of the stage 30 such that a plurality of bolts 80 as fixing members pass through the stage 30 in a thickness direction thereof. In FIG. 2, for the sake of simplicity, only one of the plurality of bolts 80 is shown to be inserted into the respective one of ten bolt holes 81.

Furthermore, an annular slit 82 having a predetermined depth is formed at a position inward of the bolt holes 81 in the upper surface of the stage 30. Pin holes 83 are formed at, for example, three locations inward of the slit 82. Support pins (not shown) used in transferring the wafer W between the processing container 10 and a transferring mechanism (not shown) installed outside of the processing container 10 are inserted into the respective pin holes 83.

In the temperature adjusting plate 32, screw holes 84 to be screwed with the respective bolts 80 are formed at positions corresponding to the bolt holes 81 of the stage 30 in the same number as the bolt holes 81. Therefore, the bolts 80 passing through the bolt holes 81 are screwed with the respective screw holes 84 so that the stage 30 is fixed to the temperature adjusting plate 32.

In addition, although not shown in FIG. 1, a plurality of bolt holes 86 through which respective bolts 85 pass in the thickness direction of the temperature adjusting plate 32, is concentrically formed in an outer peripheral portion of the temperature adjusting plate 32, as shown in FIG. 2. Further, while in FIG. 2, the bolt holes 86 has been shown to be formed inward of the screw holes 84, the positional relationship between the bolt holes 86 and the screw holes 84 is not limited to the present embodiment. In some embodiments, the positions of the bolt holes 86 and the screw holes 84 may be properly set based on the diameter of the stage 30 or the support table 31.

As shown in FIG. 2, an area inward of the bolt holes 86 in the upper surface of the temperature adjusting plate 32 are formed to be lower than the outer peripheral portion of the temperature adjusting plate 32. Accordingly, when the stage 30 is fixed to the temperature adjusting plate 32 by the bolts 80, as shown in FIG. 1, a predetermined gap S is formed between the vicinity of the central portion of the stage 30 and the vicinity of the central portion of the temperature adjusting plate 32. In other words, the stage 30 and the temperature adjusting plate 32 come into contact with each other only in the outer peripheral portions thereof.

In addition, slits 87 are formed in the outer peripheral portion of the upper surface of the temperature adjusting plate 32 such that the slits 87 are in communication with the gap S when the stage 30 and the temperature adjusting plate 32 are fixed to each other by the bolts 80. Thus, when the interior of the processing container 10 is exhausted by the exhaust mechanism 70, the gap S is vacuumed through the slits 87. In this case, the stage 30 and the temperature adjusting plate 32 are vacuum-insulated from each other by the gap S. Thus, a portion (heat radiation portion) at which heat is radiated between the stage 30 and the temperature adjusting plate 32 is restricted to the outer peripheral portions fixed by the bolts 80. In other words, the heat radiation portion between the stage 30 and the temperature adjusting plate 32 may be minimized. It is therefore possible to suppress the radiation of heat between the stage 30 and the temperature adjusting plate 32 to a minimal level. In addition, although in FIG. 2, the slits 87 extending in the radial direction of the temperature adjusting plate 32 has been shown to be formed at three locations, the shape, position, the number or the like of the slits 87 may be arbitrarily set as long as they can exhaust the interior of the gap S.

Like the stage 30, pin holes 88 are formed in the temperature adjusting plate 32 at positions corresponding to the pin holes 83 formed in the stage 30.

Screw holes 90 that are screwed with the respective bolts 85 are formed in the support table 31 in the same number as the bolt holes 86 at positions corresponding to the bolt holes 86 of the temperature adjusting plate 31. The temperature adjusting plate 32 and the support table 31 are fixed to each other by the bolts 85. In addition, like the temperature adjusting plate 32, an area inward of the screw holes 90 in an upper surface of the support table 31 is formed to be lower than an outer peripheral portion of the support table 31. Accordingly, when the temperature adjusting plate 32 and the support table 31 are fixed to each other by the bolts 85, as shown in FIG. 1, a predetermined gap T is formed between the temperature adjusting plate 32 and the support table 31 so that a contact area between the temperature adjusting plate 32 and the support table 31 is minimized.

Slits 91 are formed in the outer peripheral portion of the upper surface of the support table 31 such that the temperature adjusting plate 32 and the support table 31 are in communication with each other through the gap T when they are fixed to each other by the bolts 85. Accordingly, when the interior of the processing container 10 is exhausted, the temperature adjusting plate 32 and the support table 31 are vacuum-insulated from each other by the gap T, thereby minimizing the heat radiation portion therebetween.

In addition, although not shown in FIG. 1, a plurality of bolt holes 93 through which bolts 92 pass through the support table 31 in a thickness direction thereof is formed in the outer peripheral portion of the support table 31 in a substantially concentric relationship with, for example, the screw holes 90, as shown in FIG. 2. Screw holes (not shown) are formed at positions corresponding to the bolt holes 93 in the bottom plate 22 of the processing container 10 such that the support table 31 and the bottom plate 22 are fixed to each other by the bolts 92. Furthermore, as shown in FIG. 1, an insulating member 94 is disposed between the support table 31 and the bottom plate 22, which is made of a material of a low thermal conductivity having a resistance to process gases such as PTFE, PCTFE, or PEEK. For example, the insulating member 94 suppresses heat generated from a heater (not shown) embedded in the sidewalls 20 of the processing container 10 from being radiated to the support table 31 at a minimal level. As shown in FIG. 2, the insulating member 94 is formed in a substantially disc shape. Bolt holes 93 through which the bolts 92 pass are formed at positions corresponding to the bolt holes 93 of the support table 31.

In addition, like the stage 30 and the temperature adjusting plate 32, pin holes 96 are formed in the support table 31 and the insulating member 94, respectively.

For example, as shown in FIG. 3, a heat medium flow channel 100 is formed inside the stage 30 to circulate a heat medium of a predetermined temperature therethrough, thus adjusting a temperature of the stage 30. The heat medium flow channel 100 includes an outer peripheral flow channel 30*a* formed in the outer peripheral portion of the stage 30 and an inner peripheral flow channel 30*b* formed in the central portion of the stage 30.

For example, as illustrated by a dotted line in FIG. 3, the outer peripheral flow channel 30*a* is formed in a substantially circular arc shape to surround the bolt holes 81 at a position outward of the annular slit 82 in the outer peripheral portion of the stage 30. As shown in FIG. 4, one end portion of the outer peripheral flow channel 30a having the circular arc shape is in communication with an external heat medium supply hole 110 formed in a back surface of the stage 30. In addition, the other end portion opposite to the external heat medium supply hole 110 in the outer peripheral flow channel 30a is in communication with an external heat medium exhaust hole 111 formed in the back surface of the stage 30. By circulating a heat medium through the outer peripheral flow channel 30a via the external heat medium supply hole 110 and the external heat medium exhaust hole 111, it is possible to adjust a temperature of the outer peripheral portion of the stage 30. In addition, PEPF (perfluoropolyether) oil, water, or dry air may be used as the heat medium. Furthermore, the temperature of the heat medium falls within a range of about 25 to 120 degrees C. In the present embodiment, the temperature of the stage 30 is adjusted to, for example, 30 degrees C.

For example, as shown in FIGS. 3 and 4, the supply of the heat medium to the external heat medium supply hole 110 is performed through a through hole 112 formed to penetrate through the temperature adjusting plate 32 in the thickness direction thereof at a position corresponding to the external heat medium supply hole 110. In addition, through holes 113 are formed in the support table 31 and the insulating member 94 to pass through the support table 31 and the insulating member 94 in the thickness direction thereof at positions corresponding to the external heat medium supply hole 110. As shown in FIG. 1, a supply pipe 114 for supplying the heat medium to the through hole 113 is connected to the through hole 113 of the insulating member 94. The supply pipe 114 is connected to a heat medium supply source (not shown). The heat medium is supplied from the supply pipe 114 to the outer peripheral flow channel 30a through the through holes 112 and 113 and the external heat medium supply hole 110. In this case, the through holes 112 and 113 and the supply pipe 114 play the role of a stage heat medium supply pipe for supplying the heat medium to the outer peripheral flow channel 30a of the stage 30.

For example, as illustrated by a dotted line in FIG. 3, the inner peripheral flow channel 30b is formed in a substantially helical shape at a position inward of the annular slit 82. As shown in FIG. 4, one end portion of the inner peripheral flow channel 30b is in communication with an internal heat medium supply hole 115 formed in the back surface of the stage 30. In addition, the other end portion opposite to the internal heat medium supply hole 115 in the inner peripheral flow channel 30b is in communication with an internal heat medium discharge hole 116 formed in the back surface of the stage 30. By circulating a heat medium through the inner peripheral flow channel 30b via the internal heat medium supply hole 115 and the internal heat medium discharge hole 116, it is possible to adjust a temperature of the central portion of the stage 30. Furthermore, the inner peripheral flow channel 30b and the outer peripheral flow channel 30a are formed with the slit 82 formed therebetween. Thus, the radiation of heat between the inner peripheral flow channel 30b and the outer peripheral flow channel 30a is suppressed to a minimal level. It is therefore possible to independently control the temperature of the outer peripheral portion and the central portion of the stage 30 with high accuracy.

For example, as shown in FIGS. 3 and 4, the supply of the heat medium to the internal heat medium supply hole 115 is performed through a through hole 117 formed to penetrate through the temperature adjusting plate 32 in the thickness direction thereof at a position corresponding to the internal heat medium supply hole 115. In addition, through holes 118 are also formed in the support table 31 and the insulating member 94 to penetrate through the support table 31 and the insulating member 94 in the thickness direction thereof at positions corresponding to the internal heat medium supply hole 115. A supply pipe 119 for supplying a heat medium to the through hole 118 is connected to the through hole 118 of the insulating member 94 as shown in FIG. 1. The supply pipe 119 is connected to a heat medium supply source (not shown). The heat medium is supplied from the supply pipe 119 to the inner peripheral flow channel 30b through the through holes 117 and 118 and the internal heat medium supply hole 115. In this case, the through holes 117 and 118 and the supply pipe 119 play the role of a stage heat medium supply pipe for supplying the heat medium to the inner peripheral flow channel 30b of the stage 30.

For example, as illustrated by a dotted line in FIG. 3, an adjusting plate flow channel 120 as another heat medium flow channel for circulating the heat medium is formed inside the outer peripheral portion of the temperature adjusting plate 32. For example, the adjusting plate flow channel 120 is formed in a substantially circular arc shape to be close to the screw holes 84 or the bolt holes 86. As shown in FIG. 3, one end portion of the adjusting plate flow channel 120 formed in the circular arc shape is in communication with an adjusting plate heat medium supply hole 121 formed in the upper surface of the temperature adjusting plate 32. In addition, the other end portion opposite to the adjusting plate heat medium supply hole 121 in the adjusting plate flow channel 120 is in communication with an adjusting plate heat medium discharge hole 122 formed in the back surface of the temperature adjusting plate 32.

The adjusting plate heat medium supply hole 121 has the same diameter as that of the external heat medium exhaust hole 111 formed in the stage 30. When the temperature adjusting plate 32 and the stage 30 is fixed to each other by the bolts 80, the adjusting plate heat medium supply hole 121 is disposed to be aligned with the external heat medium exhaust hole 111. Therefore, the heat medium, which is discharged from the outer peripheral flow channel 30a through the external heat medium exhaust hole 111 of the stage 30, is supplied to the adjusting plate flow channel 120 through the adjusting plate heat medium supply hole 121. Thus, it is possible to adjust the temperature of the outer peripheral portion of the temperature adjusting plate 32, specifically the heat radiation portion where the radiation of heat occurs between the temperature adjusting plate 32 and the stage 30). In this case, the adjusting plate flow channel 120 plays the role of a temperature adjusting mechanism for adjusting the temperature of the heat radiation portion between the temperature adjusting plate 32 and the stage 30. Further, the external heat medium exhaust hole 111 and the adjusting plate heat medium supply hole 121 play the role of an adjusting plate heat medium supply pipe for supplying the heat medium that has passed through the outer peripheral flow channel 30a to the adjusting plate flow channel 120 as another heat medium flow channel. In addition, although in FIG. 3, the adjusting plate flow channel 120 has been shown to be disposed inward of the screw holes 84 and the bolt holes 86, the shape or disposition of the adjusting plate flow channel 120 is not limited to the present embodiment. In some embodiments, the adjusting plate flow channel 120 may be formed to have any configuration as long as it can adjust a temperature of the heat radiation portion.

The discharge of the heat medium from the adjusting plate heat medium discharge hole 122 is performed by through holes 123 that are formed in the support table 31 and the insulating member 94 to penetrate through the support table 31 and the insulating member 94 in the thickness direction thereof at positions corresponding to the adjusting plate heat medium discharge hole 122. As shown in FIG. 1, an exhaust pipe 124 for exhausting the heat medium from the through hole 123 is connected to the through hole 123 of the insulating member 94. The heat medium discharged from the adjusting plate heat medium discharge hole 122 is discharged outside of the processing container 10 through the exhaust pipe 124.

In addition, through holes 125, 126, and 127 are formed in the temperature adjusting plate 32, the support table 31, and the insulating member 94 to penetrate through the temperature adjusting plate 32, the support table 31, and the insulating member 94 in the thickness direction thereof at positions corresponding to the internal heat medium discharge hole 116. As shown in FIG. 1, a discharge pipe 128 for discharging the heat medium from the through hole 127 is connected to the through hole 127 of the insulating member 94. The heat medium discharged from the internal heat medium discharge hole 116 is discharged outside of the processing container 10 through the discharge pipe 128.

As shown in FIG. 1, a control device 200 is installed in the substrate processing apparatus 2. The control device 200 is, for example, a computer, and includes a program storage part (not shown). The program storage part stores a program for controlling the process of the wafer W in the substrate processing apparatus 2. In addition, the program may be recorded in, for example, a computer-readable storage medium such as a hard disc (HD), a flexible disc (FD), a compact disc (CD), a magnetic-optical disc (MO), a memory card or the like, and may be installed in the control device 200 from the storage medium.

The substrate processing apparatus 2 according to the present embodiment is configured as above. A description will be made of the process of the wafer W using the substrate processing apparatus 2 configured to as above.

In the process of the wafer W, the wafer W is loaded into the processing container 10 by a transfer mechanism (not shown) installed outside of the substrate processing apparatus 2, and is placed on the substrate placing table 1. Thereafter, the shutter 43 is closed.

In parallel with the above, process gases are supplied into the processing container 10 from the first gas supply source 61 and the second gas supply source 64, respectively, while the interior of the processing container 10 is exhausted to a predetermined pressure by the exhaust mechanism 70. In this way, a predetermined process, for example, a COR process in the present embodiment, is performed with respect to the wafer W.

In the COR process, the process gases supplied from the first gas supply source 61 and the second gas supply source 64 are supplied onto the wafer W through the shower plate 52.

In addition, during the COR process, a heat medium is supplied from the supply pipe 114 and the supply pipe 119, respectively. A temperature of the stage 30 is properly adjusted by the heat medium circulating through the outer peripheral flow channel 30$a$ and the inner peripheral flow channel 30$b$. Furthermore, the heat medium discharged from the outer peripheral flow channel 30$a$ is supplied to the adjusting plate flow channel 120. By the adjusting plate flow channel 120, a temperature in the vicinity of the screw holes 84 or the bolt holes 86, namely a temperature of the heat radiation portion where the radiation of heat occurs between the stage 30 and the temperature adjusting plate 32, may be controlled. Accordingly, it is possible to minimize the influence of the heat that is radiated from the processing container 10 to the substrate placing table 1 through, for example, the bolts 92 by which the processing container 10 and the support table 31 are fixed to each other, which snakes it possible to closely control the temperature of the stage 30 using the outer peripheral flow channel 30$a$ and the inner peripheral flow channel 30$b$. As a result, it is possible to uniformly perform the COR process throughout the surface of the wafer.

When the COR process is completed, the shutter 43 is opened. Subsequently, the wafer W placed on the substrate placing table 1 is unloaded from the substrate processing apparatus 2 by the wafer transfer mechanism (not shown). Thereafter, the wafer W is heated by a heating device installed outside of the substrate processing apparatus 2 so that reaction products generated by the COR process are vaporized and removed. In this way, a series of wafer process is completed.

According to the above embodiments, the temperature adjusting plate 32 is installed between the stage 30 and the support table 31 to adjust the temperature of the heat radiation portion defined between the stage 30 and the support table 31. Thus, it is possible to suppress radiation of heat from the support table 31 to the stage 30 to a minimal level. Thus, for example, even in the case where, by reducing the diameter of the stage 30, the bolts 80 are arranged to overlap the wafer W when viewed from the top, it is possible to properly manage the temperature of the stage 30 of the substrate placing table 1, thereby executing a desired wafer process.

Further, in the stage 30, the annular slit 82 is formed in an area inward of the bolts 80 for fixing the stage 30 and the temperature adjusting plate 32 to each other so that the radiation of heat between the outer peripheral portion of the stage 30 and the central portion thereof is suppressed to a minimal level. It is therefore possible to closely control the temperatures of the outer peripheral portion and the central portion of the stage 30.

Furthermore, the gap S is formed between the stage 30 and the temperature adjusting plate 32 and the gap T is formed between the temperature adjusting plate 32 and the support table 31. This suppresses the radiation of heat between the stage 30, the temperature adjusting plate 32, and the support table 31 to a minimal level. Therefore, it is possible to more closely control the temperature of the stage 30.

Although in the above embodiments, the gap S and gap T has been described to be respectively formed to be concave downward from the upper surfaces of the temperature adjusting plate 32 and the support table 31, the present disclosure is not limited thereto. In some embodiments, the gap S and the gap T may be formed to be concave upward from the lower surfaces of the stage 30 and the lower surface of the temperature adjusting plate 32, respectively.

Although in the above embodiments, the heat medium discharged from the outer peripheral flow channel 30$a$ is used as a heat medium to be supplied to the adjusting plate flow channel 120, a method of supplying the heat medium to the adjusting plate flow channel 120 is not limited to the present embodiment. As an example, the heat medium may be directly supplied to the adjusting plate flow channel 120 from outside of the processing container 10. However, in the case of directly supplying the heat medium to the adjusting plate flow channel 120, a supply pipe needs to be additionally installed in the processing container 10. Therefore, as in the present embodiment, the heat medium discharged from the outer peripheral flow channel 30$a$ may be used from the viewpoint of miniaturizing the processing container 10.

In addition, a flow channel of the heat medium may be configured such that the heat medium is first supplied to the adjusting plate flow channel 120 and subsequently, the heat medium discharged from the adjusting plate flow channel 120 is supplied to the outer peripheral flow channel 30a. However, from the viewpoint of controlling the temperature of the stage 30, the heat medium may be first supplied to the outer peripheral flow channel 30a and subsequently, the heat medium discharged from the outer peripheral flow channel 30a may be supplied to the adjusting plate flow channel 120 as in the present embodiment.

Furthermore, although the adjusting plate flow channel 120 has been described to be used as a temperature adjusting mechanism for adjusting the temperature of the heat radiation portion with respect to the stage 30 in the above embodiments, the temperature adjusting mechanism is not limited to the present embodiment. As an example, other temperature adjusting mechanisms such as a Peltier element may be used.

EXAMPLE

Figure 5:
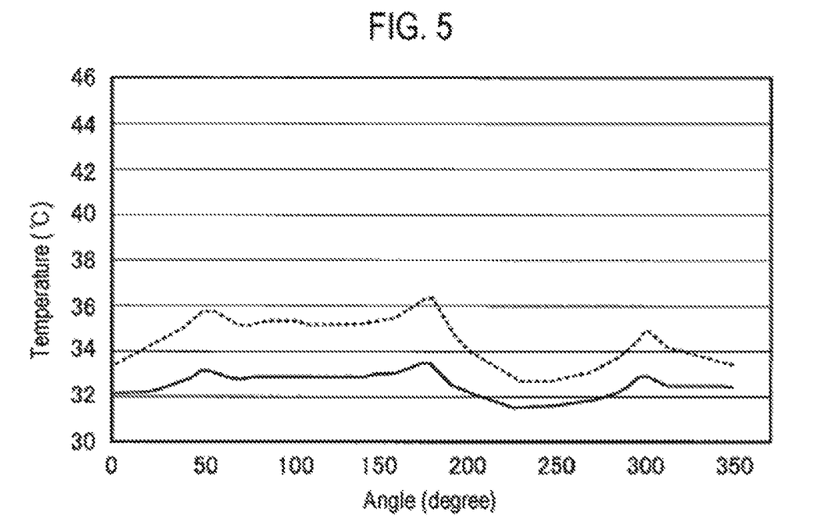
FIG. 5 is a graph illustrating measurement results of a temperature of an inner peripheral portion of a stage.
Figure 6:
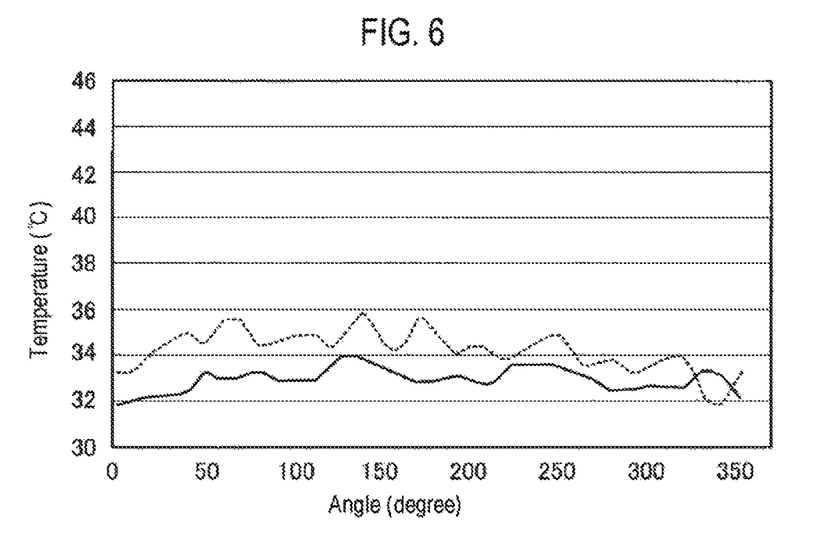
FIG. 6 is a graph illustrating measurement results of a temperature of an outer peripheral portion of a stage.

Next, an experiment was performed by the present inventors to control a temperature of the stage 30 in the substrate processing apparatus 2 according to the present embodiment, as an example. FIGS. 5 and 6 show the results of the experiment. Here, a target value of the temperature control of the stage 30 was 30 degrees C., and temperatures on the circumference having a diameter of 180 mm and on the circumference having a diameter of 242 mm in the stage 30 were measured along the respective circumferences. In addition, as a comparative example, a temperature measurement of the stage 30 was performed with respect to the case where the heat medium is not supplied to the temperature adjusting plate 32, in the similar method as the above experiment. In FIGS. 5 and 6, the horizontal axis indicates an angle on the circumference and the vertical axis indicates temperature. Furthermore, FIG. 5 shows the measuring result on the circumference having a diameter of 180 mm, and FIG. 6 shows the measuring result on the circumference having a diameter of 242 mm. The solid line indicates the case where a heat medium is supplied to the temperature adjusting plate 32, and the dotted line indicates the case where the heat medium is not supplied to the temperature adjusting plate 32.

As shown in FIGS. 5 and 6, it was confirmed that, by supplying the heat medium to the temperature adjusting plate 32, it is possible to control temperatures of the inner and outer peripheral portions of the stage 30 to approximately 32 degrees C. and suppress a difference in the temperatures to approximately 2 degrees C. Meanwhile, in the case where the heat medium is not supplied to the temperature adjusting plate 32, the temperatures of the inner and outer peripheral portions were measured as approximately 34 degrees C. and the temperature difference on the stage 30 was measured as approximately 4 degrees C. According to such results, it was confirmed that the temperature of the stage 30 can be controlled with high accuracy by supplying the heat medium to the temperature adjusting plate 32 as in the present embodiment.

Although the embodiments of the disclosure have been described in detail with reference to the accompanying drawings, the present disclosure is not limited thereto. It will be obvious to those skilled in the art that the present disclosure may have a variety of modifications and changes without departing from the scope of the technical concept shower in the claims, which belong to the technical scope of the present disclosure. Although in the above embodiments, an example in which the COR process is performed on the wafer has been described, the present disclosure may be applied to other wafer processing apparatuses using process gases, for example, a plasma processing apparatus.

EXPLANATION OF REFERENCE NUMERALS

1: Substrate placing table
2: Substrate processing apparatus
10: Processing container
20: Sidewall
21: Ceiling plate
22: Bottom plate
30: Stage
30a: Outer peripheral flow channel
30b: Inner peripheral flow channel
31: Support table
32: Temperature adjusting plate
42: Transfer port
43: Shutter
50: Shower head
52: Shower plate
70: Exhaust mechanism
80: Bolt
81: Bolt hole
82: Slit
100: Heat medium flow channel
113: Internal heat medium supply hole
120: Adjusting plate flow channel
121: Adjusting plate heat medium supply hole
122: Adjusting plate heat medium discharge hole
W: Wafer

What is claimed is:

1. A substrate placing table for placing a substrate thereon, comprising;
   a stage configured to place the substrate on an upper surface thereof, and including a heat medium flow channel formed therein to circulate a heat medium of a predetermined temperature therethrough;
   a support table configured to support the stage; and
   a temperature adjusting plate installed between the stage and the support table, and including a temperature adjusting mechanism configured to adjust a temperature of a heat radiation portion at which heat is radiated between the stage and the support table and configured to be another heat medium flow channel through which the heat medium circulates;
   a stage heat medium supply pipe connected to the heat medium flow channel of the stage to supply the heat medium to the heat medium flow channel; and
   an adjusting plate heat medium supply pipe configured to connect between the heat medium flow channel and the another heat medium flow channel of the temperature adjusting plate, and configured to supply, to the another heat medium flow channel, the heat medium which has been supplied from the stage heat medium supply pipe and subsequently, passed through the heat medium flow channel.

2. The substrate placing table according to claim 1, wherein the stage and the temperature adjusting plate are fixed to each other by a plurality of fixing members configured to fix an outer peripheral portion of the stage and an outer peripheral portion of the temperature adjusting plate to each other, and wherein a gap is formed between the stage and the temperature adjusting plate in an area inward of the plurality of fixing members.

* * * * *